(12) United States Patent
Jiang et al.

(10) Patent No.: US 11,522,527 B2
(45) Date of Patent: Dec. 6, 2022

(54) CHIP, SIGNAL LEVEL SHIFTER CIRCUIT, AND ELECTRONIC DEVICE

(71) Applicant: HUAWEI TECHNOLOGIES CO., LTD., Guangdong (CN)

(72) Inventors: Qimeng Jiang, Shenzhen (CN); Xingqiang Peng, Shenzhen (CN); Chenghao Sun, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/468,504

(22) Filed: Sep. 7, 2021

(65) Prior Publication Data

US 2021/0409005 A1 Dec. 30, 2021

Related U.S. Application Data

(63) Continuation of application No. PCT/CN2019/129783, filed on Dec. 30, 2019.

(30) Foreign Application Priority Data

Mar. 7, 2019 (CN) .......................... 201910172026.7

(51) Int. Cl.
| | |
|---|---|
| *H03K 3/011* | (2006.01) |
| *H03K 3/356* | (2006.01) |
| *H03K 17/10* | (2006.01) |
| *H01L 29/20* | (2006.01) |

(52) U.S. Cl.
CPC ....... *H03K 3/011* (2013.01); *H03K 3/356017* (2013.01); *H03K 17/10* (2013.01); *H01L 29/2003* (2013.01)

(58) Field of Classification Search
CPC ...................................................... H03K 3/011
See application file for complete search history.

(56) References Cited

U.S. PATENT DOCUMENTS

2018/0337588 A1\* 11/2018 Reusch ............... H02M 1/4225

\* cited by examiner

*Primary Examiner* — Daniel C Puentes
(74) *Attorney, Agent, or Firm* — Huawei Technologies Co., Ltd.

(57) ABSTRACT

This application discloses a chip and a signal level shifter circuit for use on a mobile terminal such as a charger or an adapter. The chip is co-packaged with a first silicon-based driver die and a second silicon-based driver die that are manufactured by using a BCD technology, and a first gallium nitride die and a second gallium nitride die that are manufactured by using a gallium nitride technology. A first silicon-based circuit is integrated on the first silicon-based driver die, a second silicon-based circuit is integrated on the second silicon-based driver die, and a high-voltage resistant gallium nitride circuit is integrated on the first gallium nitride die. In this way, it can be ensured that a second low-voltage silicon-based driver die manufactured by using a low-voltage BCD technology is not damaged by a high input voltage, thereby reducing costs of the chip.

19 Claims, 7 Drawing Sheets

CHIP, SIGNAL LEVEL SHIFTER CIRCUIT, AND ELECTRONIC DEVICE

CROSS-REFERENCE TO RELATED APPLICATIONS

This application is a continuation of International Application No. PCT/CN2019/129783, filed on Dec. 30, 2019, which claims priority to Chinese Patent Application No. 201910172026.7, filed on Mar. 7, 2019. The disclosures of the aforementioned applications are hereby incorporated by reference in their entireties.

TECHNICAL FIELD

This application relates to the field of power technologies, and in particular, to a chip, a signal level shifter circuit, and an electronic device.

BACKGROUND

Figure 1:
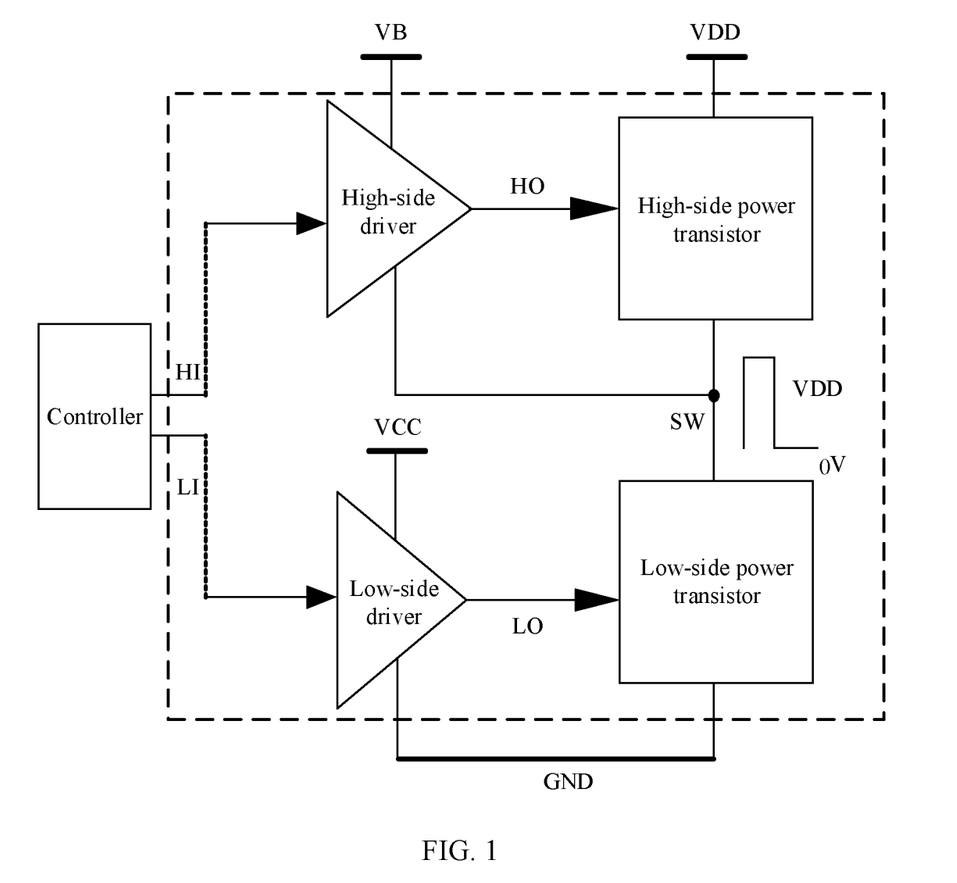
FIG. 1 is a circuit topology diagram of a half-bridge structure according to one embodiment of the disclosure.
Figure 2:
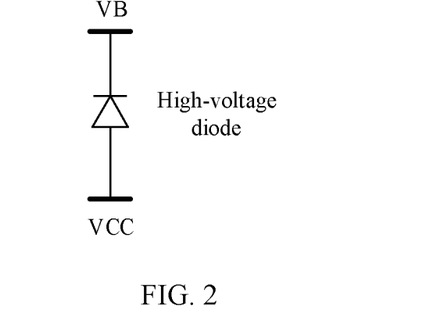
FIG. 2 is a schematic diagram of a bootstrap diode to charge a capacitor of high side according to one embodiment of the disclosure.

In a power management field, commonly used topologies include half-bridge, full-bridge, active clamp fly-back converter (active clamp fly-back converter, ACF), and the like. A half-bridge structure is used as an example. As shown in FIG. 1, the half-bridge structure includes a controller, a high-side driver, a low-side driver, a high-side power transistor, and a low-side power transistor. One end of the low-side driver is grounded, and the other end of the low-side driver is connected to a power supply VCC. An input voltage at one end of the high-side driver is a VB, and the other end of the high-side driver is connected to switching (switching, SW), where the SW is a reference voltage point of the high-side driver. As shown in FIG. 2, a VB may be a voltage transmitted by a VCC through a high-voltage diode. A low side is relative to a high side. A grounded side is generally a low side, and a side connected to SW is generally a high side. A voltage of the SW is related to an input voltage VDD of a high-side power transistor. Therefore, the voltage of the SW changes between 0 and VDD.

Because one end of the high-side driver is connected to the VB and the SW dynamically changes, a value of the VB also changes. Specifically, the value of the VB may reach hundreds of volts in a period. Therefore, the high-side driver needs to be high-voltage resistant. A high-voltage resistant component usually adopts a high-voltage BCD component manufactured by using a high-voltage BCD technology. However, the high-voltage BCD technology has a relatively high requirement, resulting in high costs of the high-voltage BCD component.

Therefore, it is urgent to provide a solution for replacing the high-side driver with a component manufactured by using a relatively simple technology while enabling a pulse signal of the controller to be normally transferred to the high-side driver.

SUMMARY

Embodiments of this application provide a chip and a signal level shifter circuit, to ensure that a low-voltage silicon-based driver die manufactured by using a low-voltage BCD technology is not damaged by a high input voltage when being used as a high-side driver, and can also normally receive a pulse signal output by a controller, thereby reducing costs of the chip and the signal level shifter circuit. The embodiments of this application further provide a corresponding electronic device.

A first aspect of this application provides a chip, where the chip is connected to a controller, and the chip may include a first silicon-based driver die, a second silicon-based driver die, a first gallium nitride die, and a second gallium nitride die, where the first silicon-based driver die is connected to the first gallium nitride die, the second silicon-based driver die is connected to the second gallium nitride die, and the first gallium nitride die is connected to the second silicon-based driver die, the first silicon-based driver die is connected to a first output terminal and a second output terminal of the controller, a pulse signal output by the first output terminal is used for driving a high-side gallium nitride power transistor, and a pulse signal output by the second output terminal is used for driving a low-side gallium nitride power transistor a first silicon-based circuit is integrated on the first silicon-based driver die, a second silicon-based circuit is integrated on the second silicon-based driver die, a gallium nitride circuit and the low-side gallium nitride power transistor are integrated on the first gallium nitride die, the high-side gallium nitride power transistor is integrated on the second gallium nitride die, and the gallium nitride circuit is high-voltage resistant, the first silicon-based circuit is connected to the gallium nitride circuit, and the gallium nitride circuit is connected to the second silicon-based circuit, the first silicon-based circuit receives the pulse signal output by the first output terminal, and transfers the pulse signal to the gallium nitride circuit. the gallium nitride circuit is configured to share an input voltage VB of the second silicon-based circuit, and the gallium nitride circuit transfers the pulse signal to the second silicon-based circuit.

It can be learned from the foregoing first aspect that, the first silicon-based circuit is integrated on the first silicon-based driver die, the second silicon-based circuit is integrated on the second silicon-based driver die, and the high-voltage resistant gallium nitride circuit is integrated on the first gallium nitride die. In this way, by connecting the high-voltage resistant gallium nitride circuit to the second silicon-based circuit, and then connecting both the two output terminals of the controller to the first silicon-based driver die, the pulse signal HI of the controller can be transferred to the second silicon-based circuit via the gallium nitride circuit. Because the gallium nitride circuit can share the input voltage VB of the second silicon-based circuit, the second silicon-based circuit is not required to be also high-voltage resistant, and in this way, the second silicon-based circuit may be a low-voltage silicon-based circuit, thereby reducing chip manufacturing complexity and also reducing costs.

With reference to the first aspect, in a first possible implementation, the first silicon-based driver die, the second silicon-based driver die, the first gallium nitride die, and the second gallium nitride die are co-packaged.

It can be learned from the first possible implementation of the first aspect that, an area of the chip can be effectively reduced through co-packaging.

With reference to the first aspect or the first possible implementation of the first aspect, in a second possible implementation, the first silicon-based circuit may include a first low-voltage MOS transistor, the gallium nitride circuit may include a first high-voltage MOS transistor, and a drain of the first low-voltage MOS transistor is connected to a source of the first high-voltage MOS transistor; the first low-voltage MOS transistor is conducted under an effect of a rising edge signal of the pulse signal, and a first current flows through the first low-voltage MOS transistor, where the first current flows from the second silicon-based circuit to the first high-voltage MOS transistor, flows from the source of the first high-voltage MOS transistor to the drain of the first low-voltage MOS transistor, and flows from a source of the first low-voltage MOS transistor to ground; and a first voltage shared by the first high-voltage MOS transistor is a product between the first current and internal resistance of the first high-voltage MOS transistor.

It can be learned from the second possible implementation of the first aspect that, under the effect of the rising edge signal of the pulse signal HI, the input voltage VB is shared via the first high-voltage MOS transistor, so that an input voltage of the second silicon-based driver die can be effectively shared.

With reference to the second possible implementation of the first aspect, in a third possible implementation, the second silicon-based circuit may include a first resistor, the input voltage VB is input from one end of the first resistor, and the other end of the first resistor is connected to a first output voltage terminal of the second silicon-based circuit; and a product between the first resistor and the first current is a first output voltage of the second silicon-based circuit generated under the effect of the rising edge signal, and the first output voltage is output via the first output voltage terminal.

It can be learned from the third possible implementation of the first aspect that, by generating the first output voltage by the first resistor, the high-side gallium nitride power transistor on the second gallium nitride die can be effectively driven to work.

With reference to the second or the third possible implementation of the first aspect, in a fourth possible implementation, the first silicon-based circuit may further include a second low-voltage MOS transistor, the gallium nitride circuit may further include a second high-voltage MOS transistor, and a drain of the second low-voltage MOS transistor is connected to a source of the second high-voltage MOS transistor; the second low-voltage MOS transistor is conducted under an effect of a falling edge signal of the pulse signal, and a second current flows through the second low-voltage MOS transistor, where the second current flows from the second silicon-based circuit to the second high-voltage MOS transistor, flows from the source of the second high-voltage MOS transistor to the drain of the second low-voltage MOS transistor, and flows from a source of the second low-voltage MOS transistor to ground; and a second voltage shared by the second high-voltage MOS transistor is a product between the second current and internal resistance of the second high-voltage MOS transistor.

It can be learned from the fourth possible implementation of the first aspect that, under the effect of the falling edge signal of the pulse signal HI, the input voltage VB is shared via the second high-voltage MOS transistor, so that an input voltage of the second silicon-based driver die can be effectively shared.

With reference to the fourth possible implementation of the first aspect, in a fifth possible implementation, the second silicon-based circuit may further include a second resistor, the input voltage VB is input from one end of the second resistor, and the other end of the second resistor is connected to a second output voltage terminal of the second silicon-based circuit; and a product between the second resistor and the second current is a second output voltage of the second silicon-based circuit generated under the effect of the falling edge signal of the pulse signal, and the second output voltage is output via the second output voltage terminal.

It can be learned from the fifth possible implementation of the first aspect that, by generating the second output voltage by the second resistor, the high-side gallium nitride power transistor on the second gallium nitride die can be effectively driven to work.

With reference to the first aspect or the first possible implementation of the first aspect, in a sixth possible implementation, the first silicon-based circuit may include a first input voltage terminal, the gallium nitride circuit may include a third high-voltage MOS transistor, and the first input voltage terminal is connected to a gate of the third high-voltage MOS transistor; the first input voltage terminal receives a rising edge signal of the pulse signal, and transfers the rising edge signal to the gate of the third high-voltage MOS transistor; the third high-voltage MOS transistor is conducted under an effect of the rising edge signal, and a third current flows through the third high-voltage MOS transistor, where the third current flows from the second silicon-based circuit to the third high-voltage MOS transistor, and flows from a source of the third high-voltage MOS transistor to ground; and a third voltage shared by the third high-voltage MOS transistor is a product between the third current and internal resistance of the third high-voltage MOS transistor.

It can be learned from the sixth possible implementation of the first aspect that, under the effect of the rising edge signal of the pulse signal HI, the input voltage VB is shared via the third high-voltage MOS transistor, so that an input voltage of the second silicon-based driver die can be effectively shared.

With reference to the sixth possible implementation of the first aspect, in a seventh possible implementation, the second silicon-based circuit may further include a third resistor, the input voltage VB is input from one end of the third resistor, and the other end of the third resistor is connected to a third output voltage terminal of the second silicon-based circuit; and a product between the third resistor and the third current is a third output voltage of the second silicon-based circuit generated under the effect of the rising edge signal, and the third output voltage is output via the third output voltage terminal.

It can be learned from the seventh possible implementation of the first aspect that, by generating the third output voltage by the third resistor, the high-side gallium nitride power transistor on the second gallium nitride die can be effectively driven to work.

With reference to the sixth or the seventh possible implementation of the first aspect, in an eighth possible implementation, the first silicon-based circuit may further include a second input voltage terminal, the gallium nitride circuit may further include a fourth high-voltage MOS transistor, and the second input voltage terminal is connected to a gate of the fourth high-voltage MOS transistor; the second input voltage terminal receives a falling edge signal of the pulse signal, and transfers the falling edge signal to the gate of the fourth high-voltage MOS transistor; the fourth high-voltage MOS transistor is conducted under an effect of the falling edge signal, and a fourth current flows through the fourth high-voltage MOS transistor, where the fourth current flows from the second silicon-based circuit to the fourth high-voltage MOS transistor, and flows from a source of the fourth high-voltage MOS transistor to ground; and a fourth voltage shared by the fourth high-voltage MOS transistor is a product between the fourth current and internal resistance of the fourth high-voltage MOS transistor.

It can be learned from the eighth possible implementation of the first aspect that, under the effect of the falling edge signal of the pulse signal HI, the input voltage VB is shared via the fourth high-voltage MOS transistor, so that an input voltage of the second silicon-based driver die can be effectively shared.

With reference to the eighth possible implementation of the first aspect, in a ninth possible implementation, the second silicon-based circuit may further include a fourth resistor, the input voltage VB is input from one end of the fourth resistor, and the other end of the fourth resistor is connected to a fourth output voltage terminal of the second silicon-based circuit; and a product between the fourth resistor and the fourth current is a fourth output voltage of the second silicon-based circuit generated under the effect of the falling edge signal, and the fourth output voltage is output via the fourth output voltage terminal.

It can be learned from the ninth possible implementation of the first aspect that, by generating the fourth output voltage by the fourth resistor, the high-side gallium nitride power transistor on the second gallium nitride die can be effectively driven to work.

A second aspect of this application provides a signal level shifter circuit, which may include: a first silicon-based circuit, a second silicon-based circuit, and a gallium nitride circuit, where the gallium nitride circuit is high-voltage resistant, the first silicon-based circuit is connected to the gallium nitride circuit, and the gallium nitride circuit is connected to the second silicon-based circuit; the first silicon-based circuit is integrated on a first silicon-based driver die, the second silicon-based circuit is integrated on a second silicon-based driver die, and the gallium nitride circuit and a low-side gallium nitride power transistor are integrated on a first gallium nitride die; the first silicon-based driver die is connected to a first output terminal and a second output terminal of a controller, a pulse signal output by the first output terminal is used for driving a high-side gallium nitride power transistor, and a pulse signal output by the second output terminal is used for driving the low-side gallium nitride power transistor, the high-side gallium nitride power transistor is integrated on a second gallium nitride die, and the second gallium nitride die is connected to the second silicon-based driver die; the first silicon-based circuit receives the pulse signal output by the first output terminal, and transfers the pulse signal to the gallium nitride circuit; the gallium nitride circuit is configured to share an input voltage VB of the second silicon-based circuit; and the gallium nitride circuit transfers the pulse signal to the second silicon-based circuit.

It can be learned from the foregoing second aspect that, the first silicon-based circuit is integrated on the first silicon-based driver die, the second silicon-based circuit is integrated on the second silicon-based driver die, and the high-voltage resistant gallium nitride circuit is integrated on the first gallium nitride die. In this way, by connecting the high-voltage resistant gallium nitride circuit to the second silicon-based circuit, and then connecting both the two output terminals of the controller to the first silicon-based driver die, the pulse signal HI of the controller can be transferred to the second silicon-based circuit via the gallium nitride circuit. Because the gallium nitride circuit can share the input voltage VB of the second silicon-based circuit, the second silicon-based circuit is not required to be also high-voltage resistant, and in this way, the second silicon-based circuit may be a low-voltage silicon-based circuit, thereby reducing chip manufacturing complexity and also reducing costs.

With reference to the second aspect, in a first possible implementation, the first silicon-based circuit may include a first low-voltage MOS transistor, the gallium nitride circuit may include a first high-voltage MOS transistor, and a drain of the first low-voltage MOS transistor is connected to a source of the first high-voltage MOS transistor; the first low-voltage MOS transistor is conducted under an effect of a rising edge signal of the pulse signal, and a first current flows through the first low-voltage MOS transistor, where the first current flows from the second silicon-based circuit to the first high-voltage MOS transistor, flows from the source of the first high-voltage MOS transistor to the drain of the first low-voltage MOS transistor, and flows from a source of the first low-voltage MOS transistor to ground; and a first voltage shared by the first high-voltage MOS transistor is a product between the first current and internal resistance of the first high-voltage MOS transistor.

It can be learned from the first possible implementation of the second aspect that, under the effect of the rising edge signal of the pulse signal HI, the input voltage VB is shared via the first high-voltage MOS transistor, so that an input voltage of the second silicon-based driver die can be effectively shared.

With reference to the first possible implementation of the second aspect, in a second possible implementation, the second silicon-based circuit may include a first resistor, the input voltage VB is input from one end of the first resistor, and the other end of the first resistor is connected to a first output voltage terminal of the second silicon-based circuit; and a product between the first resistor and the first current is a first output voltage of the second silicon-based circuit generated under the effect of the rising edge signal, and the first output voltage is output via the first output voltage terminal.

It can be learned from the second possible implementation of the second aspect that, by generating the first output voltage by the first resistor, the high-side gallium nitride power transistor on the second gallium nitride die can be effectively driven to work.

With reference to the first or the second possible implementation of the second aspect, in a third possible implementation, the first silicon-based circuit may further include a second low-voltage MOS transistor, the gallium nitride circuit may further include a second high-voltage MOS transistor, and a drain of the second low-voltage MOS transistor is connected to a source of the second high-voltage MOS transistor; the second low-voltage MOS transistor is conducted under an effect of a falling edge signal of the pulse signal, and a second current flows through the second low-voltage MOS transistor, where the second current flows from the second silicon-based circuit to the second high-voltage MOS transistor, flows from the source of the second high-voltage MOS transistor to the drain of the second low-voltage MOS transistor, and flows from a source of the second low-voltage MOS transistor to ground; and a second voltage shared by the second high-voltage MOS transistor is a product between the second current and internal resistance of the second high-voltage MOS transistor.

It can be learned from the third possible implementation of the second aspect that, under the effect of the falling edge signal of the pulse signal HI, voltage VB is shared via the second high-voltage MOS transistor, so that an input voltage of the second silicon-based driver die can be effectively shared.

With reference to the third possible implementation of the second aspect, in a fourth possible implementation, the second silicon-based circuit may further include a second resistor, the input voltage VB is input from one end of the second resistor, and the other end of the second resistor is connected to a second output voltage terminal of the second silicon-based circuit; and a product between the second resistor and the second current is a second output voltage of the second silicon-based circuit generated under the effect of the falling edge signal of the pulse signal, and the second output voltage is output via the second output voltage terminal.

It can be learned from the fourth possible implementation of the second aspect that, by generating the second output voltage by the second resistor, the high-side gallium nitride power transistor on the second gallium nitride die can be effectively driven to work.

With reference to the second aspect, in a fifth possible implementation, the first silicon-based circuit may include a first input voltage terminal, the gallium nitride circuit may include a third high-voltage MOS transistor, and the first input voltage terminal is connected to a gate of the third high-voltage MOS transistor; the first input voltage terminal receives a rising edge signal of the pulse signal, and transfers the rising edge signal to the gate of the third high-voltage MOS transistor; the third high-voltage MOS transistor is conducted under an effect of the rising edge signal, and a third current flows through the third high-voltage MOS transistor, where the third current flows from the second silicon-based circuit to the third high-voltage MOS transistor, and flows from a source of the third high-voltage MOS transistor to ground; and a third voltage shared by the third high-voltage MOS transistor is a product between the third current and internal resistance of the third high-voltage MOS transistor.

It can be learned from the fifth possible implementation of the second aspect that, under the effect of the rising edge signal of the pulse signal HI, the input voltage VB is shared via the third high-voltage MOS transistor, so that an input voltage of the second silicon-based driver die can be effectively shared.

With reference to the fifth possible implementation of the second aspect, in a sixth possible implementation, the second silicon-based circuit may further include a third resistor, the input voltage VB is input from one end of the third resistor, and the other end of the third resistor is connected to a third output voltage terminal of the second silicon-based circuit; and a product between the third resistor and the third current is a third output voltage of the second silicon-based circuit generated under the effect of the rising edge signal, and the third output voltage is output via the third output voltage terminal.

It can be learned from the sixth possible implementation of the second aspect that, by generating the third output voltage by the third resistor, the high-side gallium nitride power transistor on the second gallium nitride die can be effectively driven to work.

With reference to the fifth or the sixth possible implementation of the second aspect, in a seventh possible implementation, the first silicon-based circuit may further include a second input voltage terminal, the gallium nitride circuit may further include a fourth high-voltage MOS transistor, and the second input voltage terminal is connected to a gate of the fourth high-voltage MOS transistor; the second input voltage terminal receives a falling edge signal of the pulse signal, and transfers the falling edge signal to the gate of the fourth high-voltage MOS transistor; the fourth high-voltage MOS transistor is conducted under an effect of the falling edge signal, and a fourth current flows through the fourth high-voltage MOS transistor, where the fourth current flows from the second silicon-based circuit to the fourth high-voltage MOS transistor, and flows from a source of the fourth high-voltage MOS transistor to ground; and a fourth voltage shared by the fourth high-voltage MOS transistor is a product between the fourth current and internal resistance of the fourth high-voltage MOS transistor.

It can be learned from the seventh possible implementation of the second aspect that, under the effect of the falling edge signal of the pulse signal HI, the input voltage VB is shared via the fourth high-voltage MOS transistor, so that an input voltage of the second silicon-based driver die can be effectively shared.

With reference to the seventh possible implementation of the second aspect, in an eighth possible implementation, the second silicon-based circuit may further include a fourth resistor, the input voltage VB is input from one end of the fourth resistor, and the other end of the fourth resistor is connected to a fourth output voltage terminal of the second silicon-based circuit; and a product between the fourth resistor and the fourth current is a fourth output voltage of the second silicon-based circuit generated under the effect of the falling edge signal, and the fourth output voltage is output via the fourth output voltage terminal.

It can be learned from the eighth possible implementation of the second aspect that, by generating the fourth output voltage by the fourth resistor, the high-side gallium nitride power transistor on the second gallium nitride die can be effectively driven to work.

A third aspect of this application provides an electronic device, where the electronic device may be a charger or an adapter; and the electronic device may include a controller, a rectifier, a transformer, a chip, and a capacitor; the rectifier is configured to connect to an alternating-current power supply and is connected to the transformer, and the rectifier is also connected to the chip via the capacitor; and the transformer is connected to the chip, and the controller is connected to the chip; the rectifier is configured to: convert an alternating current into a direct current, input the direct current into the transformer, and supply power to the chip via the capacitor; the transformer is configured to scale down a voltage of the direct current; the controller is configured to output a pulse signal to the chip; and the chip is the chip in the first aspect or any possible implementation of the first aspect.

It can be learned from the foregoing solutions that, in the chip provided in the embodiments of this application, the first silicon-based circuit is integrated on the first silicon-based driver die, the second silicon-based circuit is integrated on the second silicon-based driver die, and the high-voltage resistant gallium nitride circuit is integrated on the first gallium nitride die. In this way, by connecting the high-voltage resistant gallium nitride circuit to the second silicon-based circuit, and then connecting both the two output terminals of the controller to the first silicon-based driver die, the pulse signal HI of the controller can be transferred to the second silicon-based circuit via the gallium nitride circuit. Because the gallium nitride circuit can share the input voltage VB of the second silicon-based circuit, the second silicon-based circuit is not required to be also high-voltage resistant. In this way, the second silicon-based circuit may be a low-voltage silicon-based circuit, thereby reducing chip manufacturing complexity and also reducing costs.

DESCRIPTION OF EMBODIMENTS

The following describes the embodiments of this application with reference to the accompanying drawings. Apparently, the described embodiments are merely some rather than all of the embodiments of this application. A person of ordinary skill in the art may know that, with development of technologies and emergence of a new scenario, the technical solutions provided in the embodiments of this application are also applicable to similar technical problems.

The embodiments of this application provide a chip, to ensure that a second silicon-based driver die used as a high-side driver in a high-voltage working environment is not damaged, and can also normally receive a pulse signal HI output by a controller, thereby reducing chip manufacturing complexity, and also reducing costs. The embodiments of this application further provide a corresponding signal level shifter circuit and an electronic device. The following separately provides descriptions in detail.

The embodiments of this application provide a signal level shifter circuit, and further provide a chip and an electronic device. The signal level shifter circuit may be integrated in the chip, the chip may be mounted in the electronic device, and the electronic device may be a charger or an adapter. The following describes the electronic device of this application by using a scenario in which the electronic device is a charger or an adapter as an example.

Figure 3:
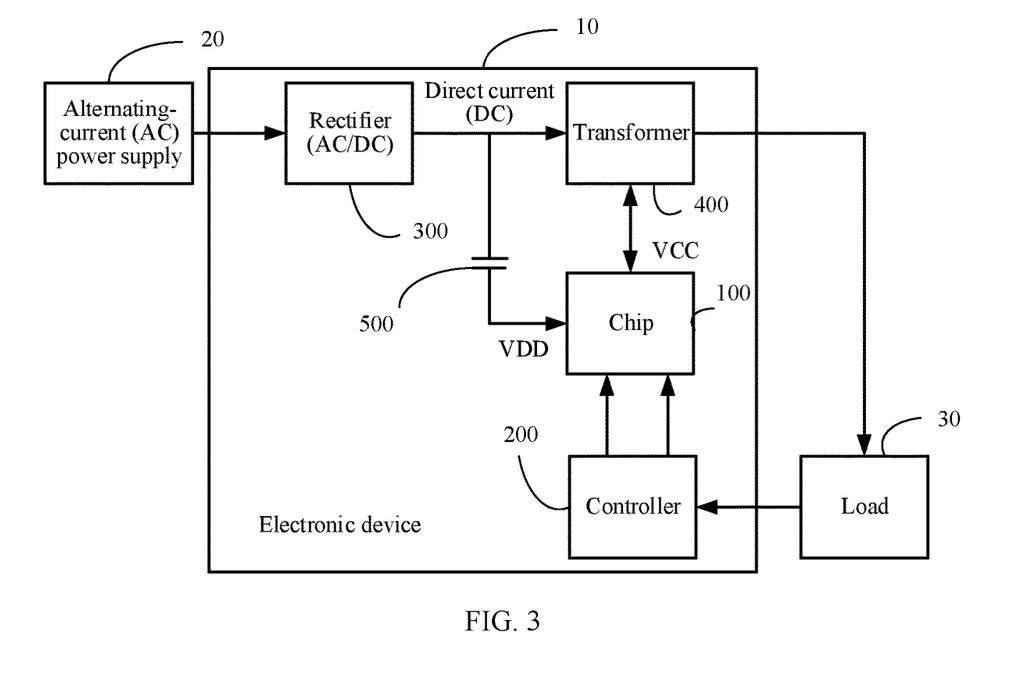
FIG. 3 is a schematic diagram of a scenario to which an electronic device is applicable according to an embodiment of this application.

FIG. 3 is a schematic diagram of a scenario to which an electronic device is applicable according to an embodiment of this application.

As shown in FIG. 3, one end of the electronic device 10 provided in this embodiment of this application may be connected to an alternating-current power supply 20, and the other end is connected to a load 30. The alternating-current power supply 20 may be 220 V mains used by a household, or may be an alternating-current power supply of another voltage value. The load 30 may be another terminal device that needs to be charged, such as a mobile phone, a tablet computer, a notebook computer, a wearable device, or a navigation device.

The electronic device 10 includes a chip 100, a controller 200, a rectifier 300, a transformer 400, and a capacitor 500.

One end of the rectifier 300 is connected to the alternating-current power supply 20. The rectifier 300 is configured to convert an alternating current into a direct current, for example, convert a 220 V alternating current into a 300 V direct current. The other end of the rectifier 300 is connected to a first end of the transformer 400. The rectifier 300 inputs a direct current to the transformer 400, and the transformer 400 may scale down a voltage of the direct current, for example, adjust a direct current of a 300 V voltage to a 20 V direct current, and supply power to the load 30 by using the adjusted voltage via a second end of the transformer 400.

A third end of the transformer 400 is connected to a chip 100, and provides an input voltage VCC for the chip 100.

The rectifier 300 is further connected to the chip 100 via a capacitor 500, and provides another input voltage VDD for the chip 100.

A controller 200 is connected to the chip 100, and is configured to output a pulse signal to the chip 100, to control the chip to work. The controller 200 is further connected to the load 30, so that when the load 30 is fully charged, the controller 200 may be notified, and the controller 200 may notify the chip 100, and further control the transformer 400 to stop charging the load, thereby avoiding damage to the load due to overcharge.

Figure 4:
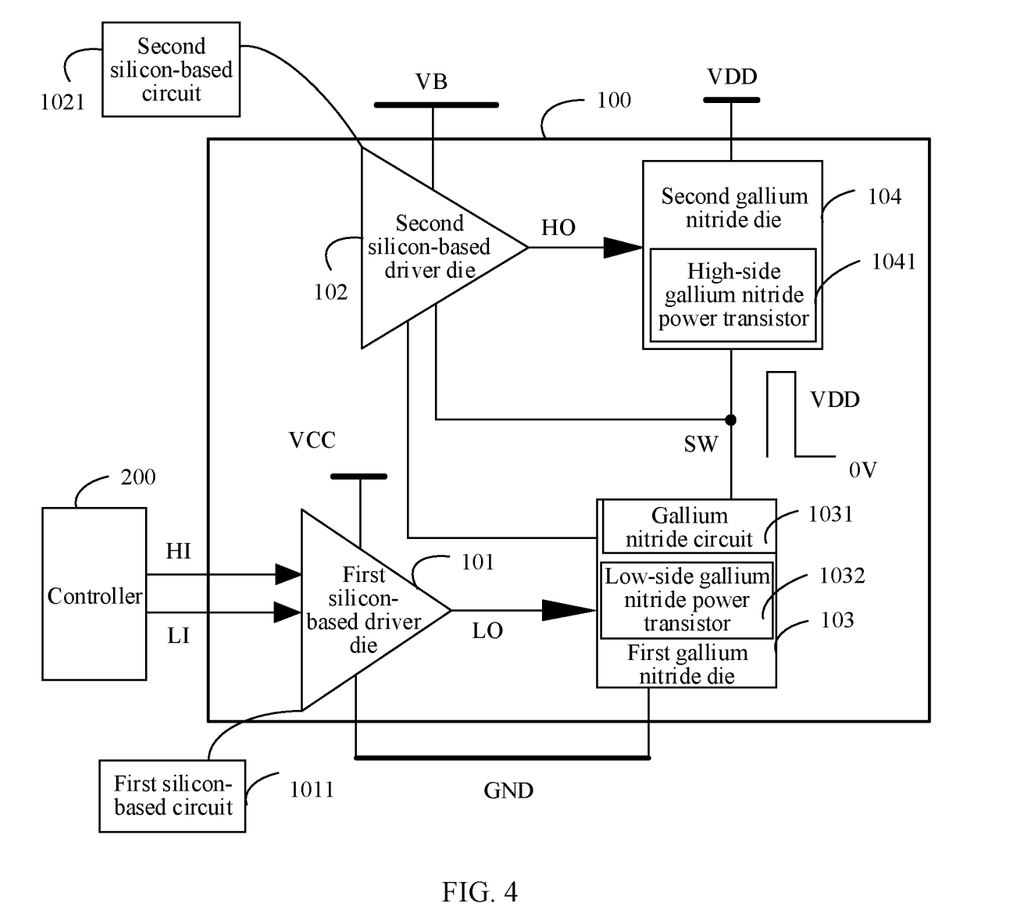
FIG. 4 is a schematic structural diagram of a chip according to an embodiment of this application.

The chip 100 may be understood with reference to FIG. 4.

FIG. 4 is a schematic structural diagram of the chip 100 according to an embodiment of this application.

As shown in FIG. 4, the chip 100 provided in this embodiment of this application is connected to a controller 200. The chip 100 includes a first silicon-based driver die 101, a second silicon-based driver die 102, a first gallium nitride die 103, and a second gallium nitride die 104. A first silicon-based circuit 1011 is integrated on the first silicon-based driver die 101, and a low-side driver may be further integrated on the first silicon-based driver die 101. A second silicon-based circuit 1021 is integrated on the second silicon-based driver die 102, and a high-side driver may be further integrated on the second silicon-based driver die 102. A gallium nitride circuit 1031 and a low-side gallium nitride power transistor 1032 are integrated on the first gallium nitride die 103, and a high-side gallium nitride power transistor 1041 is integrated on the second gallium nitride die 104.

Both two output terminals of the controller 200 are connected to the first silicon-based driver die. After a pulse signal LI output by the controller 200 passes through the first silicon-based driver die 101 and becomes LO, the low-side gallium nitride power transistor is driven. A process from LI to LO of the pulse signal is usually a signal amplification process. After a pulse signal HI output by the controller 200 is transferred to the second silicon-based driver die 102 and becomes HO, the high-side gallium nitride power transistor is driven. A transfer process of the pulse signal HI is from the first silicon-based circuit 1011, to the gallium nitride circuit 1031, and then to the second silicon-based circuit 1021, and finally, the signal HO output from the second silicon-based driver die 102 is used for driving the high-side gallium nitride power transistor 1041 to work.

It can be learned from the foregoing solution that, in the chip 100 provided in this embodiment of this application, the first silicon-based circuit 1011 is integrated on the first silicon-based driver die 101, the second silicon-based circuit 1021 is integrated on the second silicon-based driver die 102, and the high-voltage resistant gallium nitride circuit 1031 is integrated on the first gallium nitride die 103. In this way, by connecting the high-voltage resistant gallium nitride circuit 1031 to the second silicon-based circuit 1021, and then connecting both the two output terminals of the controller 200 to the first silicon-based driver die 101, the pulse signal HI of the controller can be transferred to the second silicon-based circuit 1021 via the gallium nitride circuit. Because the gallium nitride circuit 1031 can share the input voltage VB of the second silicon-based circuit, the second silicon-based circuit is not required to be also high-voltage resistant, and in this way, the second silicon-based circuit may be a low-voltage silicon-based circuit, thereby reducing chip manufacturing complexity and also reducing costs.

The first silicon-based driver die 101, the second silicon-based driver die 102, the first gallium nitride die 103, and the second gallium nitride die 104 are co-packaged, so that an area of the chip can be effectively reduced.

It should be noted that, in this embodiment of this application, a low side and a high side are relative, a grounded side is usually a low side, and a side connected to SW is usually a high side. In this embodiment of this application, a high voltage and a low voltage are also relative, which are usually defined in this field. The gallium nitride circuit 1031 is usually capable of withstanding a high voltage of several hundred volts or kilovolts.

The first silicon-based circuit 1011, the second silicon-based circuit 1021, and the gallium nitride circuit 1031 in the foregoing FIG. 4, and connection lines among the three are signal level shifter circuits. The signal level shifter circuit may be combined into the solution described in the foregoing FIG. 4, or may be an independent signal level shifter circuit. The signal level shifter circuit may be located in one device, or may be separately integrated in different devices based on an actual use requirement. A signal level shifter circuit 1000 in this embodiment of this application is described below with reference to FIG. 5.

Figure 5:
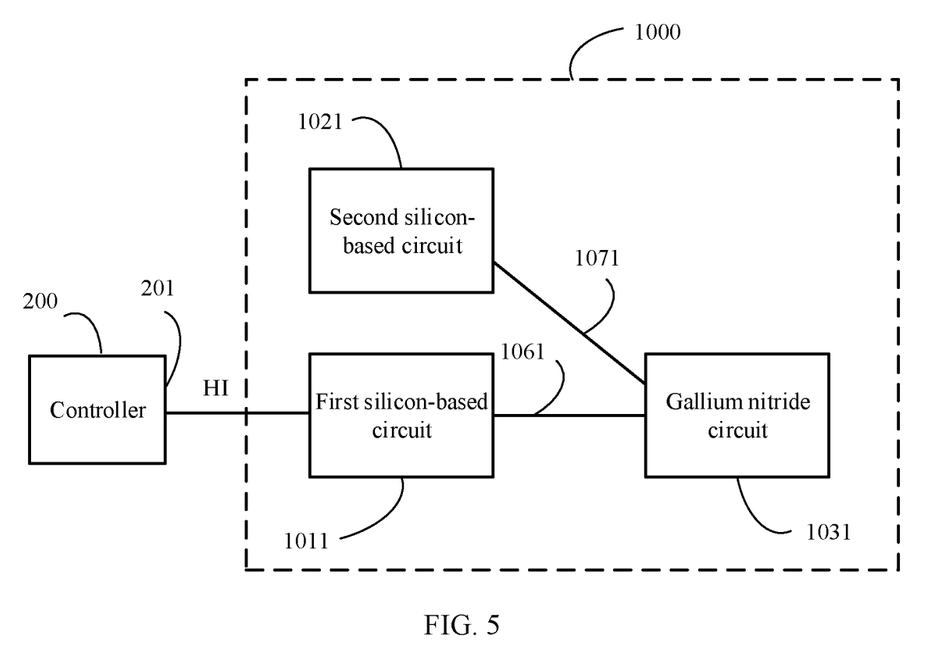
FIG. 5 is a schematic diagram of a signal level shifter circuit according to an embodiment of this application.

FIG. 5 is a schematic structural diagram of a signal level shifter circuit 1000 according to an embodiment of this application.

As shown in FIG. 5, the signal level shifter circuit 1000 in this embodiment of this application includes a first silicon-based circuit 1011, a second silicon-based circuit 1021, and a gallium nitride circuit 1031. The gallium nitride circuit 1031 is high-voltage resistant. The first silicon-based circuit 1011 is connected to the gallium nitride circuit 1031. A connection manner may be a connection via a conducting wire 1061. The gallium nitride circuit 1031 is connected to the second silicon-based circuit 1021. A connection manner may be a connection via a conducting wire 1071. The conducting wire 1061 or 1071 may be a connection line such as Bondires or leadframe.

The first silicon-based circuit 1011 is connected to a first output terminal 201 of a controller 200. A pulse signal output by the first output terminal 201 is used for driving a high-side gallium nitride power transistor, and the pulse signal output by the first output terminal 201 may be represented by HI. A second output terminal of the controller 200 is connected to a first BCD driver die. A pulse signal output by the second output terminal is used for driving a low-side gallium nitride power transistor, and the pulse signal output by the second output terminal may be represented by LI. The pulse signal LI output by the second output terminal has been described in the embodiment in FIG. 4, and is not described herein again.

After the pulse signal HI output by the first output terminal 201 reaches the first silicon-based circuit 1011, the pulse signal HI may be transferred to the gallium nitride circuit 1031 via the conducting wire 1061.

In this embodiment of this application, both the two output terminals of the controller are connected to the first silicon-based driver die, and do not need to be connected to a high-side driver die.

The first silicon-based circuit 1011 receives the pulse signal HI output by the first output terminal 201 of the controller 200, and transfers the pulse signal HI to the gallium nitride circuit 1031 via the conducting wire 1061. The gallium nitride circuit 1031 may communicate with the second silicon-based circuit 1021 via the conducting wire 1071, to share an input voltage VB of the second silicon-based circuit 1021. The gallium nitride circuit 1031 transfers the pulse signal HI to the second silicon-based circuit 1021 via the conducting wire 1071.

It can be learned from the foregoing solution that, in this embodiment of this application, the gallium nitride circuit 1031 is connected to the second silicon-based circuit 1021, and then both the two output terminals of the controller 200 are connected to the first silicon-based driver die. In this way, the pulse signal HI of the controller 200 can be transferred to the second silicon-based circuit 1021 via the gallium nitride circuit 1031. Because the gallium nitride circuit 1031 can share the input voltage VB of the second silicon-based circuit 1021, the second silicon-based circuit 1021 is not required to be also high-voltage resistant, and in this way, the second silicon-based circuit 1021 may be a low-voltage silicon-based circuit, and the second silicon-based driver die is also only required to be a low-voltage silicon-based driver die, thereby reducing costs of the signal level shifter circuit.

The foregoing describes working processes of the signal level shifter circuit 1000 and the controller 200 as a whole. Because this embodiment of this application focuses on describing how to transfer the pulse signal to the second silicon-based circuit 1021 via the first silicon-based circuit 1011 and the gallium nitride circuit 1031, the following separately describes this process by using different embodiments.

Figure 6:
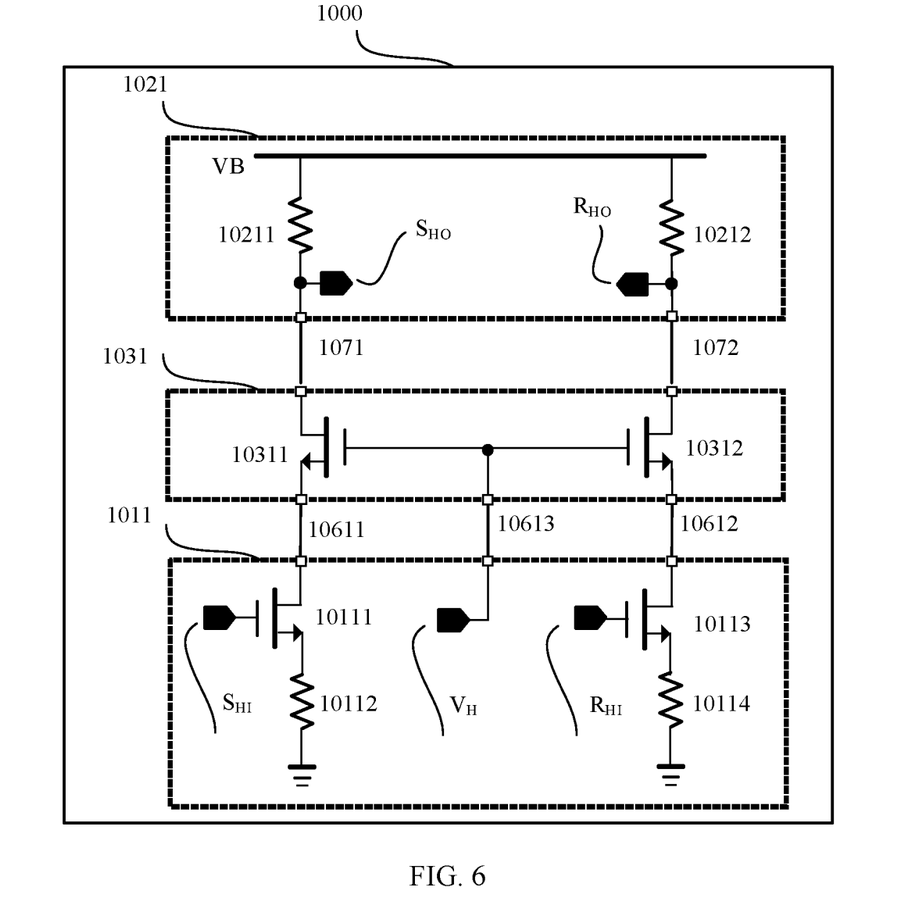
FIG. 6 is another schematic diagram of a signal level shifter circuit according to an embodiment of this application.

FIG. 6 is a schematic structural diagram of the signal level shifter circuit according to this embodiment of this application.

As shown in FIG. 6, in another embodiment of the signal level shifter circuit 1000 provided in this embodiment of this application, the first silicon-based circuit 1011 includes a first low-voltage MOS transistor 10111, the gallium nitride circuit 1031 includes a first high-voltage MOS transistor 10311, and a drain of the first low-voltage MOS transistor 10111 is connected to a source of the first high-voltage MOS transistor 10311.

The first low-voltage MOS transistor 10111 is conducted under an effect of a rising edge signal $S_{HI}$ of the pulse signal, and a first current flows through the first low-voltage MOS transistor 10111, where the first current flows from the second silicon-based circuit 1021 to the first high-voltage MOS transistor 10311, flows from the source of the first high-voltage MOS transistor 10311 to the drain of the first low-voltage MOS transistor 10111, and flows from a source of the first low-voltage MOS transistor 10111 to ground. A first voltage shared by the first high-voltage MOS transistor 10311 is a product between the first current and internal resistance of the first high-voltage MOS transistor.

The second silicon-based circuit 1021 includes a first resistor 10211, the input voltage VB is input from one end of the first resistor 10211, and the other end of the first resistor 10211 is connected to a first output voltage terminal of the second silicon-based circuit 1021. A voltage output by the first output voltage terminal is $S_{HO}$. A product between the first resistor 10211 and the first current is a first output voltage $S_{HO}$ of the second silicon-based circuit 1021 generated under the effect of the rising edge signal $S_{HI}$, and the first output voltage $S_{HO}$ is output via the first output voltage terminal.

As shown in FIG. 6, the first silicon-based circuit 1011 further includes a second low-voltage MOS transistor

10113, the gallium nitride circuit 1031 further includes a second high-voltage MOS transistor 10312, and a drain of the second low-voltage MOS transistor 10113 is connected to a source of the second high-voltage MOS transistor 10312.

The second low-voltage MOS transistor 10113 is conducted under an effect of a falling edge signal $R_{HI}$ of the pulse signal, and a second current flows through the second low-voltage MOS transistor 10113, where the second current flows from the second silicon-based circuit 1021 to the second high-voltage MOS transistor 10312, flows from the source of the second high-voltage MOS transistor 10312 to the drain of the second low-voltage MOS transistor 10113, and flows from a source of the second low-voltage MOS transistor 10113 to ground. A second voltage shared by the second high-voltage MOS transistor 10312 is a product between the second current and internal resistance of the second high-voltage MOS transistor.

The second silicon-based circuit 1021 further includes a second resistor 10212, the input voltage VB is input from one end of the second resistor 10212, and the other end of the second resistor 10212 is connected to a second output voltage terminal of the second silicon-based circuit 1021; and a product between the second resistor and the second current is a second output voltage $R_{HO}$ of the second silicon-based circuit 1021 generated under the effect of the falling edge signal of the pulse signal, and the second output voltage $R_{HO}$ is output via the second output voltage terminal.

Figure 7:
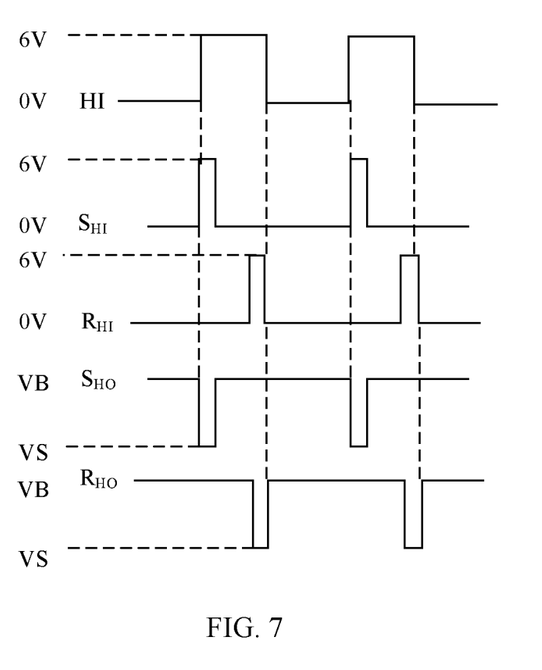
FIG. 7 is a schematic diagram of an example of a pulse signal according to an embodiment of this application.

The following describes a voltage division process of the gallium nitride circuit 1031 and a process from $S_{HI}$ to $S_{HO}$ and from $R_{HI}$ to $R_{HO}$ of signals in another manner with reference to FIG. 6 and FIG. 7.

As shown in FIG. 6, a port in the first silicon-based circuit 1011 is connected to a gate of the first high-voltage MOS transistor 10311 via a conducting wire 10613, and the first high-voltage MOS transistor 10311 is conducted by using an input voltage VH. In this way, after the first low-voltage MOS transistor 10111 is conducted under the effect of the rising edge signal $S_{HI}$ of the pulse signal HI, a path from one end that is connected to the input voltage VB and that is of the first resistor 10211 to the drain of the first high-voltage MOS transistor 10311 via a conducting wire 10711, then to the source of the first high-voltage MOS transistor 10311, to the drain of the first low-voltage MOS transistor 10111 via a conducting wire 10611, and then to the source of the first low-voltage MOS transistor 10111, then to the resistor 10112, and then to the ground is formed. The first current flows from the first resistor 10211 to the ground through the foregoing path. The pulse signal HI is usually 6 V, provided that the first low-voltage MOS transistor 10111 can be conducted. A voltage value of the pulse signal HI may be determined based on an actual situation.

A voltage of the foregoing path is VB. The first current flows from the first resistor 10211 to the ground, voltage division is implemented in a flow process of the first current, the first current flows through the first high-voltage MOS transistor 10311, and a voltage shared by the first high-voltage MOS transistor 10311 is the product between the first current and the internal resistance of the first high-voltage MOS transistor 10311. Because the internal resistance of the first high-voltage MOS transistor 10311 is very large, the first high-voltage MOS transistor 10311 also shares a very large voltage. The other end of the first resistor 10211 is connected to the output terminal of the second silicon-based circuit 1021. The voltage $S_{HO}$ output by the output terminal is the product between the first current and the first resistor 10211. A resistance value of the first resistor is usually not large, and therefore $S_{HO}$ is not large, either. The second silicon-based circuit may use a low-voltage BCD device.

Similarly, for an end of the falling edge signal $R_{HI}$ of the pulse signal HI, a process is also basically the same. A port in the first silicon-based circuit 1011 is connected to a gate of the second high-voltage MOS transistor 10312 via the conducting wire 10613, and the second high-voltage MOS transistor 10312 is conducted by using the input voltage VH. In this way, after the second low-voltage MOS transistor 10113 is conducted under the effect of the falling edge signal $R_{HI}$ of the pulse signal HI, a path from one end that is connected to the input voltage VB and that is of the second resistor 10212 to the drain of the second high-voltage MOS transistor 10312 via a conducting wire 10712, then to the source of the second high-voltage MOS transistor 10312, to the drain of the second low-voltage MOS transistor 10113 via a conducting wire 10612, and then to the source of the second low-voltage MOS transistor 10113, then to the resistor 10114, and then to the ground is formed. The second current flows from the second resistor 10212 to the ground through the foregoing path. The pulse signal HI is usually 6 V, provided that the second low-voltage MOS transistor 10113 can be conducted. A voltage value of the pulse signal HI may be determined based on an actual situation.

A voltage of the foregoing path is VB. The second current flows from the second resistor 10212 to the ground, voltage division is implemented in a flow process of the second current, the second current flows through the second high-voltage MOS transistor 10312, and a voltage shared by the second high-voltage MOS transistor 10312 is the product between the second current and the internal resistance of the second high-voltage MOS transistor 10312. Because the internal resistance of the second high-voltage MOS transistor 10312 is very large, the second high-voltage MOS transistor 10312 also shares a very large voltage. The other end of the second resistor 10212 is connected to the output terminal of the second silicon-based circuit 1021. The voltage $R_{HO}$ output by the output terminal is the product between the second current and the second resistor 10212. A resistance value of the second resistor is usually not large, and therefore $R_{HO}$ is not large, either. The second silicon-based circuit may use a low-voltage BCD device.

Figure 8:
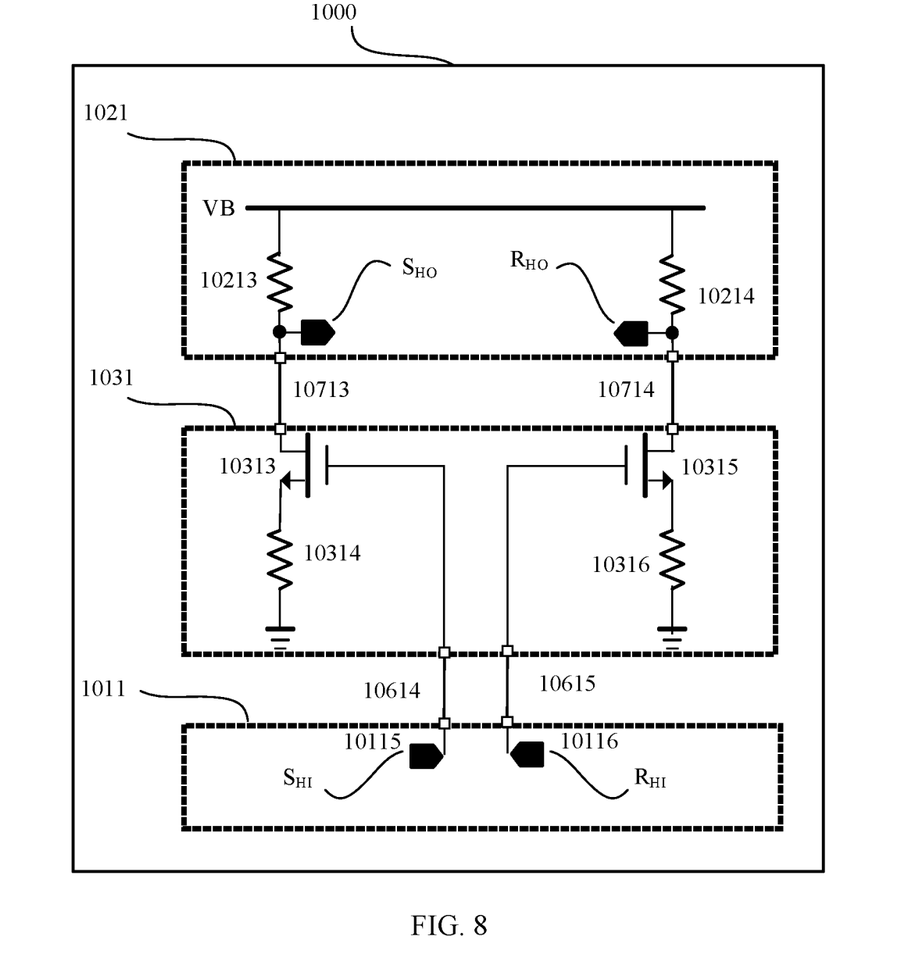
FIG. 8 is another schematic diagram of a signal level shifter circuit according to an embodiment of this application.

FIG. 6 describes an implementation, and the following describes another implementation with reference to FIG. 8.

FIG. 8 is another schematic structural diagram of the signal level shifter circuit according to this embodiment of this application.

As shown in FIG. 8, in the signal level shifter circuit in this embodiment of this application, the first silicon-based circuit 1011 includes a first input voltage terminal 10115, the gallium nitride circuit 1031 includes a third high-voltage MOS transistor 10313, and the first input voltage terminal 10115 is connected to a gate of the third high-voltage MOS transistor 10313.

The first input voltage terminal receives the rising edge signal $S_{HI}$ of the pulse signal, and transfers the rising edge signal $S_{HI}$ to the gate of the third high-voltage MOS transistor 10313. The third high-voltage MOS transistor 10313 is conducted under an effect of the rising edge signal and a third current flows through the third high-voltage MOS transistor 10313. The third current flows from the second silicon-based circuit 1021 to the third high-voltage MOS transistor 10313, and flows from a source of the third high-voltage MOS transistor 10313 to the ground. A third voltage shared by the third high-voltage MOS transistor 10313 is a product between the third current and internal resistance of the third high-voltage MOS transistor.

The second silicon-based circuit 1021 further includes a third resistor 10213. The input voltage VB is input from one end of the third resistor 10213, and the other end of the third resistor 10213 is connected to a third output voltage terminal of the second silicon-based circuit 1021. A product between the third resistor 10213 and the third current is a third output voltage of the second silicon-based circuit 1021 generated under the effect of the rising edge signal, and the third output voltage $S_{HO}$ is output via the third output voltage terminal.

The first silicon-based circuit 1011 further includes a second input voltage terminal 10116, the gallium nitride circuit 1031 further includes a fourth high-voltage MOS transistor 10315, and the second input voltage terminal 10116 is connected to a gate of the fourth high-voltage MOS transistor 10315. The second input voltage terminal 10116 receives a falling edge signal $R_{HI}$ of the pulse signal, and transfers the falling edge signal $R_{HI}$ to the gate of the fourth high-voltage MOS transistor 10315. The fourth high-voltage MOS transistor 10315 is conducted under an effect of the falling edge signal, and a fourth current flows through the fourth high-voltage MOS transistor 10315, where the fourth current flows from the second silicon-based circuit 1021 to the fourth high-voltage MOS transistor 10315, and flows from a source of the fourth high-voltage MOS transistor 10315 to the ground. A fourth voltage shared by the fourth high-voltage MOS transistor 10315 is a product between the fourth current and internal resistance of the fourth high-voltage MOS transistor 10315.

The second silicon-based circuit 1021 further includes a fourth resistor 10214, the input voltage VB is input from one end of the fourth resistor 10214, and the other end of the fourth resistor 10214 is connected to a fourth output voltage terminal of the second silicon-based circuit 1021. A product between the fourth resistor 10214 and the fourth current is a fourth output voltage of the second silicon-based circuit 1021 generated under the effect of the falling edge signal, and the fourth output voltage $R_{HO}$ is output via the fourth output voltage terminal.

The following describes the voltage division process of the gallium nitride circuit 1031 and the process from $S_{HI}$ to $S_{HO}$ and from $R_{HI}$ to $R_{HO}$ of signals in another manner with reference to FIG. 7 and FIG. 8.

After the rising edge signal $S_{HI}$ is input from the first input voltage terminal 10115, the rising edge signal $S_{HI}$ is transferred to the gate of the third high-voltage MOS transistor 10313 via a conducting wire 10614, to further conduct the third high-voltage MOS transistor 10313, thereby forming a path from one end that is connected to the input voltage VB and that is of the third resistor 10213 to the drain of the third high-voltage MOS transistor 10313 via a conducting wire 10713, then to the source of the third high-voltage MOS transistor 10313, and to the ground via a resistor 10314.

A voltage of the foregoing path is designated VB. The third current flows from the third resistor 10213 to the ground, voltage division is implemented in a flow process of the third current, the third current flows through the third high-voltage MOS transistor 10313, and a voltage shared by the third high-voltage MOS transistor 10313 is the product between the third current and the internal resistance of the third high-voltage MOS transistor 10313. Because the internal resistance of the third high-voltage MOS transistor 10313 is very large, the third high-voltage MOS transistor 10313 also shares a very large voltage. The other end of the third resistor 10213 is connected to the output terminal of the second silicon-based circuit 1021. The voltage $S_{HO}$ output by the output terminal is the product between the third current and the third resistor 10213. A resistance value of the third resistor 10213 is usually not large, and therefore $S_{HO}$ is not large, either. The second silicon-based circuit 1021 uses a low-voltage BCD device.

Similarly, for an end of the falling edge signal $R_{HI}$ of the pulse signal HI, a process is also basically the same. After the falling edge signal $R_{HI}$ is input from the second input voltage terminal 10116, the falling edge signal $R_{HI}$ is transferred to the gate of the fourth high-voltage MOS transistor 10315 via a conducting wire 10615, to further conduct the fourth high-voltage MOS transistor 10315, thereby forming a path from one end that is connected to the input voltage VB and that is of the fourth resistor 10214 to the drain of the fourth high-voltage MOS transistor 10315 via a conducting wire 10714, then to the source of the fourth high-voltage MOS transistor 10315, and to the ground via a resistor 10316.

A voltage of the foregoing path is designated VB. The fourth current flows from the fourth resistor 10214 to the ground, voltage division is implemented in a flow process of the fourth current, the fourth current flows through the fourth high-voltage MOS transistor 10315, and a voltage shared by the fourth high-voltage MOS transistor 10315 is the product between the fourth current and the internal resistance of the fourth high-voltage MOS transistor 10315. Because the internal resistance of the fourth high-voltage MOS transistor 10315 is very large, the fourth high-voltage MOS transistor 10315 also shares a very large voltage. The other end of the fourth resistor 10214 is connected to the output terminal of the second silicon-based circuit 1021. The voltage $R_{HO}$ output by the output terminal is the product between the fourth current and the fourth resistor 10214. A resistance value of the fourth resistor 10214 is usually not large, and therefore $R_{HO}$ is not large, either. The second silicon-based circuit 1021 uses a low-voltage BCD device, so that costs of the signal level shifter circuit are reduced.

It should be noted that, in the foregoing embodiments, a half bridge is merely used as an example for illustration. Actually, a circuit of another structure may also use the idea of the signal level shifter circuit provided in the embodiments of this application.

The signal level shifter circuit, the chip, and the electronic device provided in the embodiments of this application are described in detail above. The principle and implementation of this application are described herein through specific examples. The description about the embodiments is merely provided to help understand the method and core ideas of this application. In addition, persons of ordinary skill in the art can make variations and modifications to this application in terms of the specific implementations and application scopes according to the ideas of this application. Therefore, the content of specification shall not be construed as a limit to this application.

In addition, techniques, systems, subsystems, and methods described and illustrated in the various embodiments as discrete or separate may be combined or integrated with other systems, modules, techniques, or methods without departing from the scope of the present disclosure. Items shown or discussed as connected, coupled, or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A chip, wherein the chip is connected to a controller, and the chip comprises:
   a first silicon-based driver die, a second silicon-based driver die, a first gallium nitride die, and a second gallium nitride die, wherein the first silicon-based driver die is connected to the first gallium nitride die, the second silicon-based driver die is connected to the second gallium nitride die, and the first gallium nitride die is connected to the second silicon-based driver die;
   the first silicon-based driver die is connected to a first output terminal and a second output terminal of the controller, a pulse signal output by the first output terminal is used for driving a high-side gallium nitride power transistor, and a pulse signal output by the second output terminal is used for driving a low-side gallium nitride power transistor;
   a first silicon-based circuit is integrated on the first silicon-based driver die, a second silicon-based circuit is integrated on the second silicon-based driver die, a gallium nitride circuit and the low-side gallium nitride power transistor are integrated on the first gallium nitride die, the high-side gallium nitride power transistor is integrated on the second gallium nitride die, and the gallium nitride circuit is high-voltage resistant;
   the first silicon-based circuit is connected to the gallium nitride circuit, and the gallium nitride circuit is connected to the second silicon-based circuit;
   the first silicon-based circuit receives the pulse signal output by the first output terminal, and transfers the pulse signal to the gallium nitride circuit;
   the gallium nitride circuit is configured to share an input voltage VB of the second silicon-based circuit; and
   the gallium nitride circuit transfers the pulse signal to the second silicon-based circuit.

2. The chip according to claim 1, wherein the first silicon-based driver die, the second silicon-based driver die, the first gallium nitride die, and the second gallium nitride die are co-packaged.

3. The chip according to claim 1, wherein the first silicon-based circuit comprises a first low-voltage MOS transistor, the gallium nitride circuit comprises a first high-voltage MOS transistor, and a drain of the first low-voltage MOS transistor is connected to a source of the first high-voltage MOS transistor;
   the first low-voltage MOS transistor is conducted under an effect of a rising edge signal of the pulse signal, and a first current flows through the first low-voltage MOS transistor, wherein the first current flows from the second silicon-based circuit to the first high-voltage MOS transistor, flows from the source of the first high-voltage MOS transistor to the drain of the first low-voltage MOS transistor, and flows from a source of the first low-voltage MOS transistor to ground; and
   a first voltage shared by the first high-voltage MOS transistor is a product between the first current and internal resistance of the first high-voltage MOS transistor.

4. The chip according to claim 3, wherein the second silicon-based circuit comprises a first resistor, the input voltage VB is input from one end of the first resistor, and the other end of the first resistor is connected to a first output voltage terminal of the second silicon-based circuit; and
   a product between the resistance of the first resistor and the first current is a first output voltage of the second silicon-based circuit generated under the effect of the rising edge signal, and the first output voltage is output via the first output voltage terminal.

5. The chip according to claim 3, wherein the first silicon-based circuit further comprises a second low-voltage MOS transistor, the gallium nitride circuit further comprises a second high-voltage MOS transistor, and a drain of the second low-voltage MOS transistor is connected to a source of the second high-voltage MOS transistor;
   the second low-voltage MOS transistor is conducted under an effect of a falling edge signal of the pulse signal, and a second current flows through the second low-voltage MOS transistor, wherein the second current flows from the second silicon-based circuit to the second high-voltage MOS transistor, flows from the source of the second high-voltage MOS transistor to the drain of the second low-voltage MOS transistor, and flows from a source of the second low-voltage MOS transistor to ground; and
   a second voltage shared by the second high-voltage MOS transistor is a product between the second current and internal resistance of the second high-voltage MOS transistor.

6. The chip according to claim 5, wherein the second silicon-based circuit further comprises a second resistor, the input voltage VB is input from one end of the second resistor, and the other end of the second resistor is connected to a second output voltage terminal of the second silicon-based circuit; and
   a product between the resistance of the second resistor and the second current is a second output voltage of the second silicon-based circuit generated under the effect of the falling edge signal of the pulse signal, and the second output voltage is output via the second output voltage terminal.

7. The chip according to claim 1, wherein the first silicon-based circuit comprises a first input voltage terminal, the gallium nitride circuit comprises a third high-voltage MOS transistor, and the first input voltage terminal is connected to a gate of the third high-voltage MOS transistor;
   the first input voltage terminal receives a rising edge signal of the pulse signal, and transfers the rising edge signal to the gate of the third high-voltage MOS transistor;
   the third high-voltage MOS transistor is conducted under an effect of the rising edge signal, and a third current flows through the third high-voltage MOS transistor, wherein the third current flows from the second silicon-based circuit to the third high-voltage MOS transistor, and flows from a source of the third high-voltage MOS transistor to ground; and
   a third voltage shared by the third high-voltage MOS transistor is a product between the third current and internal resistance of the third high-voltage MOS transistor.

8. The chip according to claim 7, wherein the second silicon-based circuit further comprises a third resistor, the input voltage VB is input from one end of the third resistor, and the other end of the third resistor is connected to a third output voltage terminal of the second silicon-based circuit; and
   a product between the resistance of the third resistor and the third current is a third output voltage of the second silicon-based circuit generated under the effect of the rising edge signal, and the third output voltage is output via the third output voltage terminal.

9. The chip according to claim 7, wherein the first silicon-based circuit further comprises a second input voltage terminal, the gallium nitride circuit further comprises a fourth high-voltage MOS transistor, and the second input voltage terminal is connected to a gate of the fourth high-voltage MOS transistor;

the second input voltage terminal receives a falling edge signal of the pulse signal, and transfers the falling edge signal to the gate of the fourth high-voltage MOS transistor;

the fourth high-voltage MOS transistor is conducted under an effect of the falling edge signal, and a fourth current flows through the fourth high-voltage MOS transistor, wherein the fourth current flows from the second silicon-based circuit to the fourth high-voltage MOS transistor, and flows from a source of the fourth high-voltage MOS transistor to ground; and a fourth voltage shared by the fourth high-voltage MOS transistor is a product between the fourth current and internal resistance of the fourth high-voltage MOS transistor.

10. The chip according to claim 9, wherein the second silicon-based circuit further comprises a fourth resistor, the input voltage VB is input from one end of the fourth resistor, and the other end of the fourth resistor is connected to a fourth output voltage terminal of the second silicon-based circuit; and a product between the resistance of the fourth resistor and the fourth current is a fourth output voltage of the second silicon-based circuit generated under the effect of the falling edge signal, and the fourth output voltage is output via the fourth output voltage terminal.

11. A signal level shifter circuit, comprising:

a first silicon-based circuit, a second silicon-based circuit, and a gallium nitride circuit, wherein the gallium nitride circuit is high-voltage resistant, the first silicon-based circuit is connected to the gallium nitride circuit, and the gallium nitride circuit is connected to the second silicon-based circuit;

the first silicon-based circuit is integrated on a first silicon-based driver die, the second silicon-based circuit is integrated on a second silicon-based driver die, and the gallium nitride circuit and a low-side gallium nitride power transistor are integrated on a first gallium nitride die;

the first silicon-based driver die is connected to a first output terminal and a second output terminal of a controller, a pulse signal output by the first output terminal is used for driving a high-side gallium nitride power transistor, and a pulse signal output by the second output terminal is used for driving the low-side gallium nitride power transistor, the high-side gallium nitride power transistor is integrated on a second gallium nitride die, and the second gallium nitride die is connected to the second silicon-based driver die;

the first silicon-based circuit receives the pulse signal output by the first output terminal, and transfers the pulse signal to the gallium nitride circuit;

the gallium nitride circuit is configured to share an input voltage VB of the second silicon-based circuit; and the gallium nitride circuit transfers the pulse signal to the second silicon-based circuit.

12. The signal level shifter circuit according to claim 11, wherein the first silicon-based circuit comprises a first low-voltage MOS transistor, the gallium nitride circuit comprises a first high-voltage MOS transistor, and a drain of the first low-voltage MOS transistor is connected to a source of the first high-voltage MOS transistor;

the first low-voltage MOS transistor is conducted under an effect of a rising edge signal of the pulse signal, and a first current flows through the first low-voltage MOS transistor, wherein the first current flows from the second silicon-based circuit to the first high-voltage MOS transistor, flows from the source of the first high-voltage MOS transistor to the drain of the first low-voltage MOS transistor, and flows from a source of the first low-voltage MOS transistor to ground; and a first voltage shared by the first high-voltage MOS transistor is a product between the first current and internal resistance of the first high-voltage MOS transistor.

13. The signal level shifter circuit according to claim 12, wherein the second silicon-based circuit comprises a first resistor, the input voltage VB is input from one end of the first resistor, and the other end of the first resistor is connected to a first output voltage terminal of the second silicon-based circuit; and a product between the resistance of the first resistor and the first current is a first output voltage of the second silicon-based circuit generated under the effect of the rising edge signal, and the first output voltage is output via the first output voltage terminal.

14. The signal level shifter circuit according to claim 12, wherein the first silicon-based circuit further comprises a second low-voltage MOS transistor, the gallium nitride circuit further comprises a second high-voltage MOS transistor, and a drain of the second low-voltage MOS transistor is connected to a source of the second high-voltage MOS transistor;

the second low-voltage MOS transistor is conducted under an effect of a falling edge signal of the pulse signal, and a second current flows through the second low-voltage MOS transistor, wherein the second current flows from the second silicon-based circuit to the second high-voltage MOS transistor, flows from the source of the second high-voltage MOS transistor to the drain of the second low-voltage MOS transistor, and flows from a source of the second low-voltage MOS transistor to ground; and a second voltage shared by the second high-voltage MOS transistor is a product between the second current and internal resistance of the second high-voltage MOS transistor.

15. The signal level shifter circuit according to claim 14, wherein the second silicon-based circuit further comprises a second resistor, the input voltage VB is input from one end of the second resistor, and the other end of the second resistor is connected to a second output voltage terminal of the second silicon-based circuit; and a product between the resistance of the second resistor and the second current is a second output voltage of the second silicon-based circuit generated under the effect of the falling edge signal of the pulse signal, and the second output voltage is output via the second output voltage terminal.

16. The signal level shifter circuit according to claim 11, wherein the first silicon-based circuit comprises a first input voltage terminal, the gallium nitride circuit comprises a third high-voltage MOS transistor, and the first input voltage terminal is connected to a gate of the third high-voltage MOS transistor;

the first input voltage terminal receives a rising edge signal of the pulse signal, and transfers the rising edge signal to the gate of the third high-voltage MOS transistor;

the third high-voltage MOS transistor is conducted under an effect of the rising edge signal, and a third current flows through the third high-voltage MOS transistor, wherein the third current flows from the second silicon-based circuit to the third high-voltage MOS transistor, and flows from a source of the third high-voltage MOS transistor to ground; and a third voltage shared by the third high-voltage MOS transistor is a product between the third current and internal resistance of the third high-voltage MOS transistor.

17. The signal level shifter circuit according to claim 16, wherein the second silicon-based circuit further comprises a third resistor, the input voltage VB is input from one end of the third resistor, and the other end of the third resistor is connected to a third output voltage terminal of the second silicon-based circuit; and a product between the resistance of the third resistor and the third current is a third output voltage of the second silicon-based circuit generated under the effect of the rising edge signal, and the third output voltage is output via the third output voltage terminal.

18. The signal level shifter circuit according to claim 16, wherein the first silicon-based circuit further comprises a second input voltage terminal, the gallium nitride circuit further comprises a fourth high-voltage MOS transistor, and the second input voltage terminal is connected to a gate of the fourth high-voltage MOS transistor;

the second input voltage terminal receives a falling edge signal of the pulse signal, and transfers the falling edge signal to the gate of the fourth high-voltage MOS transistor;

the fourth high-voltage MOS transistor is conducted under an effect of the falling edge signal, and a fourth current flows through the fourth high-voltage MOS transistor, wherein the fourth current flows from the second silicon-based circuit to the fourth high-voltage MOS transistor, and flows from a source of the fourth high-voltage MOS transistor to ground; and a fourth voltage shared by the fourth high-voltage MOS transistor is a product between the fourth current and internal resistance of the fourth high-voltage MOS transistor.

19. The signal level shifter circuit according to claim 18, wherein the second silicon-based circuit further comprises a fourth resistor, the input voltage VB is input from one end of the fourth resistor, and the other end of the fourth resistor is connected to a fourth output voltage terminal of the second silicon-based circuit; and a product between the resistance of the fourth resistor and the fourth current is a fourth output voltage of the second silicon-based circuit generated under the effect of the falling edge signal, and the fourth output voltage is output via the fourth output voltage terminal.

\* \* \* \* \*